ured surface.
United States Patent [19]
Batchelder

[11] Patent Number: 5,900,354
[45] Date of Patent: May 4, 1999

[54] METHOD FOR OPTICAL INSPECTION AND LITHOGRAPHY

[76] Inventor: John Samuel Batchelder, 2 Campbell Dr., Somers, N.Y. 10589

[21] Appl. No.: 08/887,698

[22] Filed: Jul. 3, 1997

[51] Int. Cl.$^6$ ...................................................... G03F 7/20
[52] U.S. Cl. ........................................... 430/395; 430/311
[58] Field of Search ..................................... 430/311, 313, 430/395

[56] References Cited

U.S. PATENT DOCUMENTS

| | | | |
|---|---|---|---|
| 5,121,256 | 6/1992 | Corle | 359/664 |
| 5,322,988 | 6/1994 | Russell | 219/121.69 |
| 5,610,683 | 3/1997 | Takahashi | 355/53 |

*Primary Examiner*—Kathleen Duda

[57] ABSTRACT

A process for illuminating a structured surface initially introduces a fluid into a volume, the fluid nearly completely chemically inactive with respect to the structured surface. Next, pressure and temperature are established within the volume which maintains the fluid in a supercritical state. The structured surface is then immersed in the supercritical fluid, and optical energy is directed through the supercritical fluid and onto the structured surface.

17 Claims, 4 Drawing Sheets

METHOD FOR OPTICAL INSPECTION AND LITHOGRAPHY

FIELD OF THE INVENTION

This invention relates to optical inspection and lithography performed on surfaces and, more particularly, to a method for immersing the illuminated surfaces in super-critical fluids to achieve improved resolution at a constant wavelength.

BACKGROUND OF THE INVENTION

This invention relates to processes for creating and inspecting semiconductor devices and, more particularly, to an immersion type optical system for lithographically printing patterns and for inspecting patterns.

Generally both optical lithography and inspection are performed today by illuminating the surface of the semiconductor wafers while the wafer is immersed in a gas at ambient pressure. Some defect examinations might use oil immersion microscopy. To obtain greater resolution, alternative techniques are under development including electron beam illumination, x-ray illumination, and ion beam illumination.

U.S. Pat. No. 5,121,256 discusses placing a solid immersion lens in proximity to a wafer, while the wafer itself is maintained in air at ambient pressure. U.S. Pat. No. 5,610,683 proposes immersing the wafer in a high index of refraction liquid.

Accordingly, it is an object of the invention to provide an improved method of optical lithography, wherein the method employs a super-critical fluid as an immersion medium.

It is another object of the invention to proved an improved method of optical inspection, wherein the method employs a super-critical fluid as an immersion medium.

SUMMARY

The surface of an object to be optically patterned or inspected is immersed in a super-critical fluid. The surface is illuminated through the super-critical fluid. If the surface is to be optically patterned, the illumination is spatially structured to expose the pattern on the surface. If the surface is already patterned and it is to be inspected, the illumination that reflects off of the surface will contain spatial structure.

DETAILED DESCRIPTION

Figure 1:
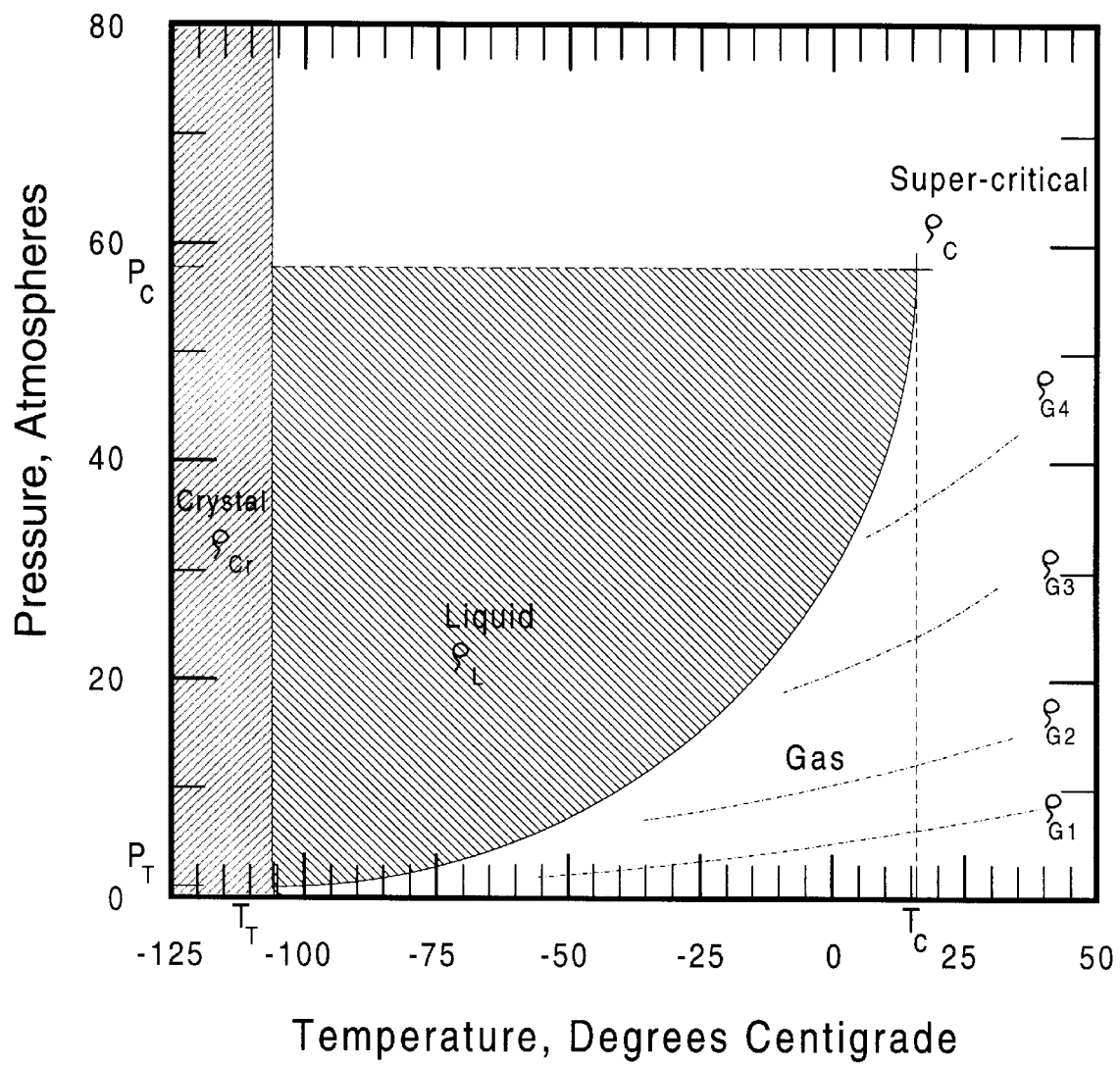
FIG. 1 shows a phase diagram for xenon, and in particular shows parameters for which xenon is a super-critical fluid.

In what follows, we restrict the discussion of super-critical immersion optics to semiconductor processing and inspection applications. This restriction is for specificity and convenience. Alternative applications of this technique include data storage, biological imaging, film thickness measurement, and micro-machining.

Both the image forming process in semiconductor manufacturing, or lithography, and the image analysis process in semiconductor manufacturing, or inspection, are aggressively pressing the limits of optics. Alternative technologies such as electron beams and x-rays are capable of finer resolution than is typically achievable by optics, but the semiconductor industry has continued to perform as many steps as possible with optical lithography and inspection, due to the generally lower processing costs and more complete engineering of the current optical systems.

Super-critical immersion optics potentially delays the migration of lithography and inspection to alternative technologies for several years. Many of the system engineering issues are un-affected by changing from air immersion of the wafers to super-critical fluid immersion; these includes most of the optical system, the masks, the detectors, the focusing systems, and the resists.

INSPECTION SPEED AND RESOLUTION

Inspection speed is generally governed by photon counting statistics. Increasing the aerial resolution by super-critical immersion will proportionately decrease the aerial inspection speed, assuming that the rest of the optical system is constant. The aerial scanning speed can be restored by well known methods such as additional detector parallelism, increased illumination brightness, and decreased background scattered light levels.

Inspection resolution is typified by the Rayleigh resolution criteria, which is $$\text{resolution} = \frac{0.77\lambda_{vac}}{NA}$$

$$NA = n\sin(\theta)$$

NA is the numerical aperture, $\lambda_{vac}$ is the vacuum wavelength of the coherent monochromatic light, n is the index of refraction of the medium in which the object is immersed, and $\theta$ is the acceptance cone half angle of a idealized circular aperture objective lens.

Resolution can be increased by decreasing the wavelength, increasing the acceptance angle of the objective lens, and by increasing the index of refraction of the immersing medium.

The depth of focus decreases quadratically with increasing numerical aperture:

$$\text{focus\_depth} = \frac{kn\lambda_{vac}}{NA^2}$$

where k is a proportionality constant that depends on the depth of focus criterion. Notice that the resolution and depth of focus both vary linearly with the wavelength, and that they also vary linearly with the inverse of the index of refraction.

Immersion oils give resolution improvement at a constant lens aperture and vacuum wavelength by increasing the index of the medium in which the light is propagating. Super-critical fluid immersion gives similar optical performance to standard oil immersion techniques without the drawbacks of contacting the specimen with a liquid.

LITHOGRAPHIC SPEED AND RESOLUTION

The rate at which images can be printed is a function of the photoresist sensitivity, the source brightness and power, the optical efficiency of the system, and the duty cycle of the stepping or scanning process.

The minimum feature size will be reduced in proportion to the factor by which the index of the surrounding media is increased, assuming the resist characteristics do no limit the feature size. Note that the index matching layer on top of the resist (if one is used) will need to be modified from its nominal values for air exposure.

Assuming that the photoresist retains the same sensitivity at the higher resolution associated with immersion, the aerial exposure rate should remain constant going from air immersion to super-critical fluid immersion.

LIQUID IMMERSION

Immersion optics have been avoided to date for semiconductor lithography and inspection for four primary reasons:

Bubbles

A major problem with immersion lithography is that most photoresists release gas upon exposure. This gas can form bubbles at the resist/liquid interface or in the liquid, which in turn creates scattered light and printing defects.

Inadequate wetting

A major problem with immersion inspection is the complex geometry and highly varied surface chemistry of the features on a wafer. If the liquid is a sufficiently good wetting agent that it uniformly penetrates the trenches and vias, then strong measures are required to remove the liquid completely from the wafer once inspection has been performed.

Wafer contamination

It is difficult to wet a complex surface, such as that of a semiconductor wafer in its manufacturing process, and then to dry or un-wet that surface, without leaving an undesirable residue. Liquids are more difficult to filter properly than gasses, so that there are particulate and molecular contaminants in most liquids that will in part adhere to the wafer. The chemical potential of the surface is also modified by contact with the liquid. The liquid can partially dissolve desirable features on the wafer, or diffuse into films.

Process complexity

To the extent that addition careful process steps are required to avoid wafer contamination and bubbles, the cost and development advantages of optics with respect to other technologies is reduced or eliminated.

Super-critical fluid immersion eliminates by design the problems of trapped bubbles and inadequate wetting. With the proper choice of fluid, wafer contamination should not be an issue. There is additional process complexity in incorporating super-critical fluid immersion into an existing lithography or inspection system, however the costs and risks associated with that complexity are favorable compared to the costs and risks for developing new systems at correspondingly shorter wavelengths.

SUPER-CRITICAL FLUIDS

When a liquid is heated above its critical temperature, it ceases to be a liquid. For example, FIG. 1 shows a phase diagram for xenon. The boundary between liquid and gas begins at the triple point (−111.9° C. and 11.9 psi) and ends at the critical point (16.6° C. and 847 psi). At temperatures above the critical temperature the material is a gas whose density increases with pressure.

If either the temperature is above the critical temperature or the pressure is above the critical pressure, then the fluid is super-critical. If the temperature is below the critical temperature and the pressure is below the critical pressure, and the material has not solidified, then the fluid is sub-critical. A sub-critical fluid can either be a gas or a liquid, while there is no distinction between gas and liquid for a super-critical fluid.

At densities near the critical density, the gas does not behave as an ideal gas. Increasing the pressure does not create a proportional increase in density, for example. The index of refraction is typically is proportional to fluid density, so that increasing the density produces a gain in resolution. Therefore little is gained by operating the immersion fluid at temperatures or pressures significantly higher than the critical pressure. There is merit, however, in operating at a temperature sufficiently above the critical point that unusual phenomena associated with the critical point do not interfere with the lithographic or inspection processes. For example, fluids such as carbon dioxide become anomalously good solvents at their critical points. Local fluctuations in density can cause optical scattering at the critical point. The most preferred embodiment allows for operating the immersion fluid above the critical temperature, hence the term super-critical immersion.

SURFACE WETTING AND BUBBLE ELIMINATION

Eliminating the liquid component from an optical immersion fluid eliminates many problems. There are no bubbles. Gas evolved from photoresist during exposure is released into the immersion fluid, where it remains as a mixture until it is pumped out at the end of the process cycle. The fluid penetrates all features of the surface without inhibitions from surface wetting. From a processing point of view, super-critical immersion appears as a replacement gas for the air that is usually used in contact with the wafer.

CONTAMINATION AVOIDANCE

The super-critical fluid needs to be chosen so that it is readily filtered for particulate and molecular contamination. It should be nearly completely chemically inactive, and should not dissolve any of the construction materials used on the wafer.

THE PROCESS OF SUPER-CRITICAL IMMERSION

The reason to change the immersion fluid from the usual air at STP to a super-critical fluid is to increase the index of refraction. Far from absorption bands of the fluid, the index increases as one plus the square root of the density of electrons. Based on this simple model, we estimate the index of refraction of a number of fluids near their critical points in Table 1. Xenon has an index greater than that for water under visible light. Several provide at least a 20% reduction in effective wavelength.

TABLE 1

Physical Constants of Some Fluids

| Fluid | Critical Temp. °C. | Critical Press. PSI | Critical Density Gram/cm$^3$ | Est. Critical Index of Refraction |
|---|---|---|---|---|
| Ammonia | 132.35 | 1,646 | 0.23 | 1.084 |
| Bromotrifluoromethane (R13B1) | 67.05 | 576 | 0.76 | 1.26 |
| Carbon dioxide | 30.95 | 1,070 | 0.47 | 1.17 |
| Carbon tetrafluoride | −45.55 | 542 | 0.63 | 1.21 |
| Chlorotrifluoromethane (R13) | 28.85 | 561 | 0.58 | 1.20 |
| Ethane | 32.35 | 708 | 0.20 | 1.074 |
| Ethylene | 9.15 | 731 | 0.26 | 1.095 |
| Nitrogen dioxide | 157.85 | 1,465 | 0.52 | 1.18 |
| Sulfur hexafluoride | 45.55 | 545 | 0.77 | 1.26 |
| Xenon | 16.55 | 847 | 1.11 | 1.36 |

The super-critical fluid should have no absorption bands near the illuminating wavelength. For example, xenon absorbs around 0.14 microns, so that super-critical xenon would preferably be used with wavelengths longer than 0.14 microns.

The temperature and pressure at which the critical point occurs are intrinsic properties of the immersion fluid. For the sake of processing convenience, the critical point should be as close as possible to STP, or 27° C. and 14.7 psi. In order not to damage the structures on a wafer, the critical temperature needs to be less than a few hundred degrees Celsius.

All of the super-critical fluids listed in Table 1 are preferred embodiments. The use of xenon as the super-critical fluid is a most preferred embodiment.

Xenon is currently available in sealed glass containers at $20 per liter or $3.60 per gram. At its critical density the cost density of xenon is $4 per milliliter or $112,000 per cubic foot.

SUPER-CRITICAL IMMERSION LITHOGRAPHY

Figure 2:
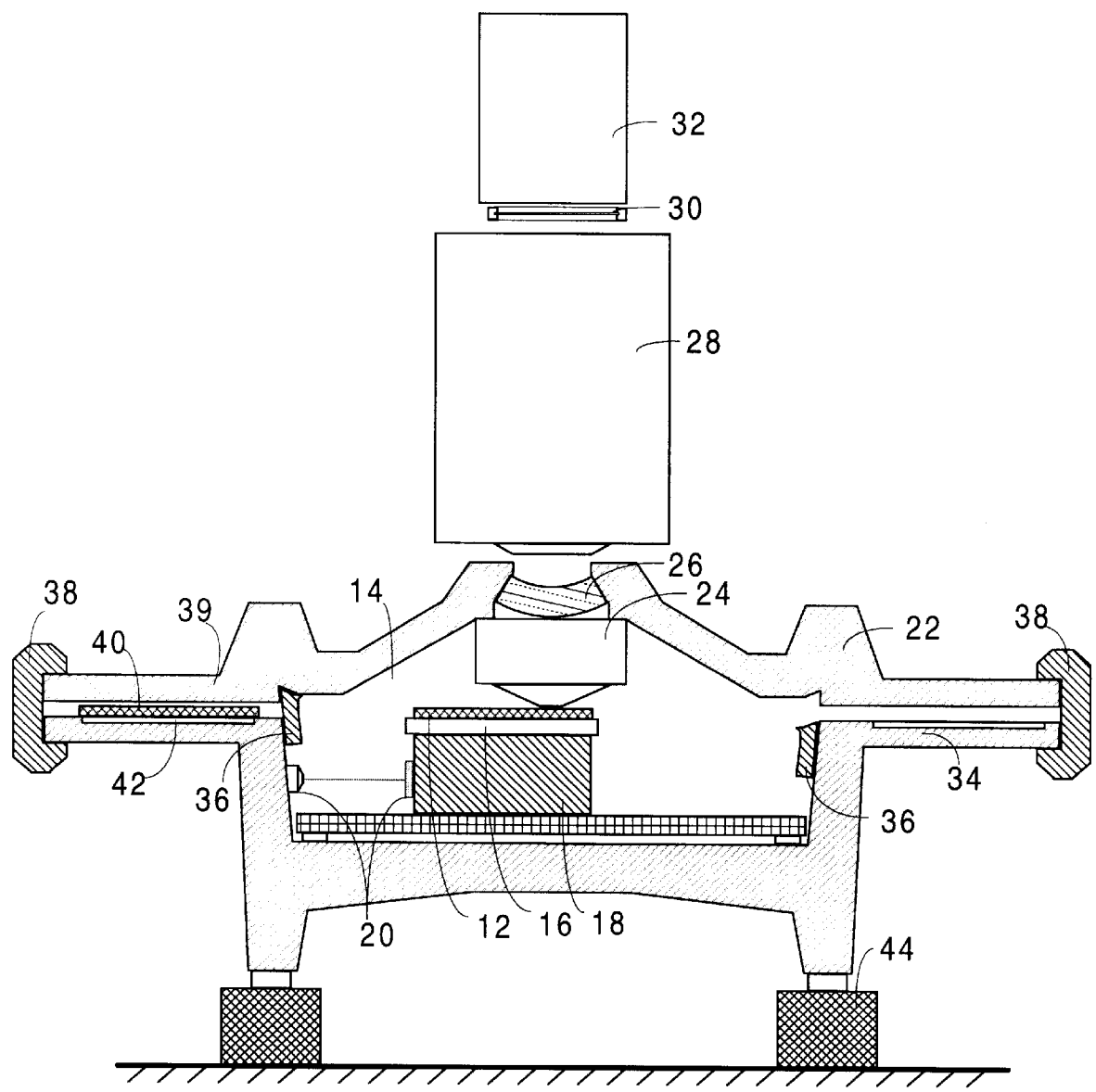
FIG. 2 shows a preferred embodiment of an optical lithographic system employing super-critical immersion.

FIG. 2 shows a preferred embodiment of super-critical immersion lithography. A photoresist covered semiconductor wafer (12) resides in a temperature and pressure controlled chamber filled with xenon gas at 875 psi and 25° C. (14). The wafer will typically have a structured surface. The minimal amount of structure on the wafer's surface is layers parallel to the plane of the wafer's surface composed of the substrate and a photoresist layer. The structured surface can be considerably more complex in the direction along the surface normal, including multi-layer resists, deposited films, and reacted coatings. It can also be structured in the plane of the surface, including surface topology and embedded patterns from previous lithography steps. The wafer is chucked by a vacuum pin chuck (16), which is transported about the chamber by a five axis stage (18). A multiple axis laser interferometer (20) feeds back the stage position to the control system. Note that the increased index of the ambient fluid in the chamber also improves the resolution of the interferometer. The chamber is formed by a heavy steel weldment (22), which additionally provides thermal and vibrational stability. The optical elements closest to the wafer (24) are themselves immersed in the super-critical fluid. Reflective optics are preferable for these immersed elements since their optic power is not affected by immersion, and since they can be made for good efficiency with ultraviolet light. An optical element (26) makes the pressure transition between the supercritical fluid and ambient air. A candidate lens for this transition would be a zero diopter fluorite meniscus lens oriented with its center of curvature outside of the chamber (14). More generally, the transition optical element should be chosen to have minimal birefringence and mechanical distortion when it is supporting a large differential pressure. The remaining optical train consists of the main objective lens (28), a reticule with two pellicles (30), and an illumination system (32). Light from the illumination system (32) is spatially modulated in amplitude and/or phase by the reticule (30), and the resulting pattern of structured light is imaged onto the photoresist surface of the wafer (12) by the main objective lens (28). The entire chamber is mounted on vibration isolators (34).

It is desirable to cycle the smallest volume of super-critical fluid possible when feeding wafers into and out of the chamber (14). In this embodiment wafer load and un-load is accomplished with two attached load lock chambers (34). Each load lock has a gate (36) into the main chamber and a gate (38) allowing access to wafer cassettes through standard wafer handlers. When a wafer (40) is initially placed in a load lock chamber, it is surrounded by ambient air. After the outer door (38) seals, gas is pumped into the load lock to bring it up to critical pressure. At the initial stage of that fill process, the gas entering the load lock will chill the load lock and the wafer. A heater (42) in the walls of the load lock is pulsed with sufficient energy to compensate for the cooling effect during the initial fill. After the load lock has stabilized at the correct temperature and pressure, the inner gate (36) can be opened and the wafer transferred to the exposure chuck. Pre-alignment can be performed in the load locks, or prior to transferring the wafer into the load lock.

Figure 3:
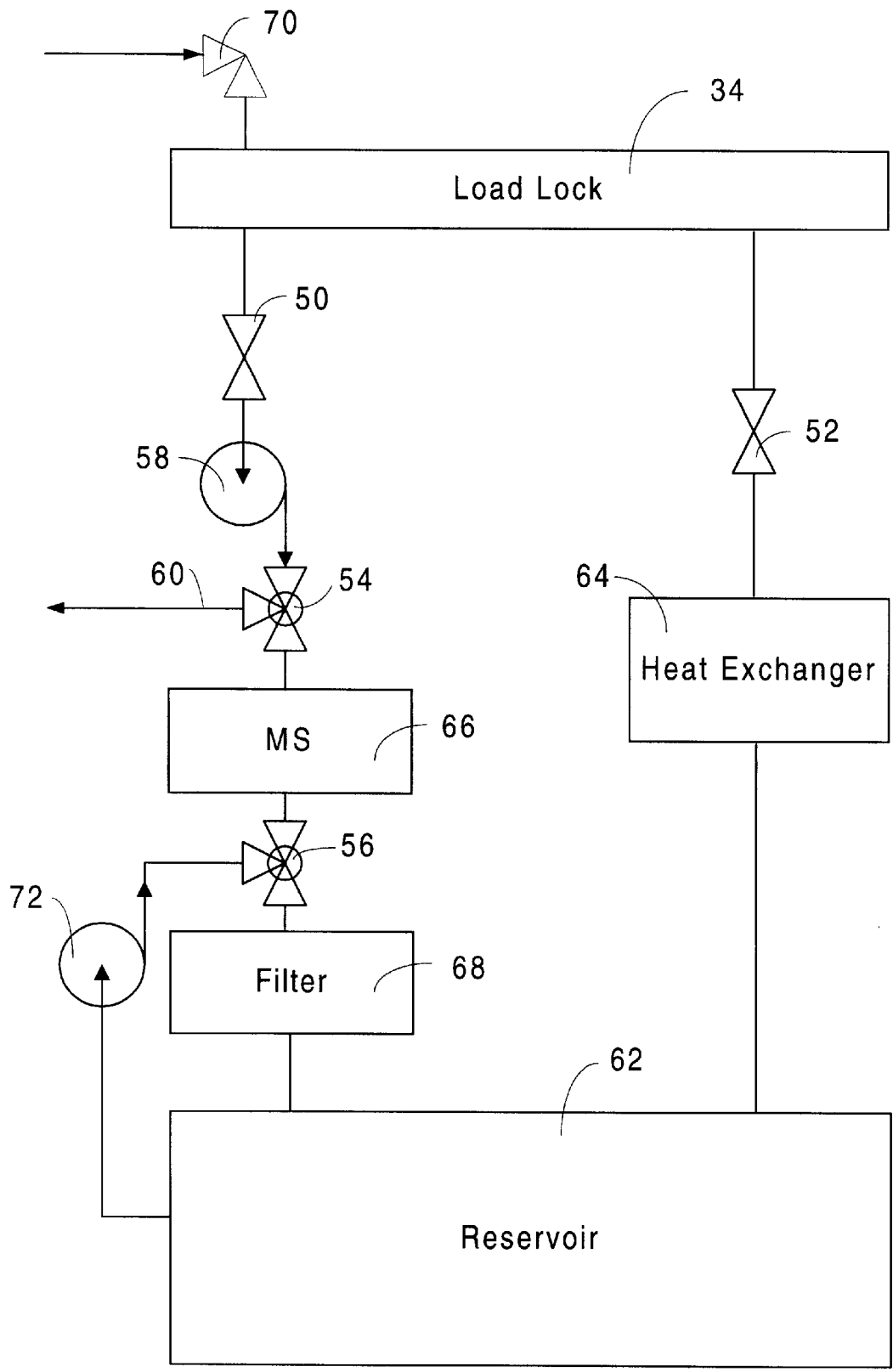
FIG. 3 shows a preferred embodiment of the super-critical fluid recycling system for a lithographic system employing super-critical immersion.

Each cycle of a load lock offers the chance for impurities to collect in the super-critical fluid supply. FIG. 3 shows a possible purification system for recycling the fluid. At the start of a cycle the load lock (34) contains air at ambient pressure, and all valves (50, 52, 54, 56, and 70) are closed. Once the lock gates (36 and 38) have been closed, two valves (50 and 52) are opened and a pump (58) draws a vacuum in the load lock, exhausting gas to waste (60). With vacuum established, two valves (50 and 54) are closed and an inlet valve (52) is opened, allowing super-critical fluid to pass from a reservoir (62), through a final heat exchanger (64) to regulate the temperature of the fluid, finally entering the load lock (34). At this point the internal gate (36) can open and the wafer can enter the exposure chamber (14). During the second half of the cycle, the wafer re-enters the load lock at super-critical pressure and temperature and the internal gate (36) closes. Three valves (50, 54, and 56) open and a pump (58) exhausts the load lock through a molecular sieve (66) and a recirculation filter (68) into the reservoir (62). With the load lock at vacuum, three valves (50, 54, and 56) are closed and a valve (70) is opened to bleed in atmosphere into the load lock. A recirculation pump (72) cooperates with a three way valve (56) when the load lock is not cycling to continually pass the super-critical fluid in the reservoir through a filter (68).

Another preferred embodiment for super-critical lithography would have the entire wafer cassette pass through the load lock. This requires substantially more volume of super-critical fluid, and would take longer to purge and equilibrate. A less preferred embodiment as the exposure chamber itself be purged and re-filled for every wafer; this is less preferred due to the large volume required and the inevitable temperature cycling that would be imposed on the optical system.

SUPER-CRITICAL IMMERSION INSPECTION

Figure 4:
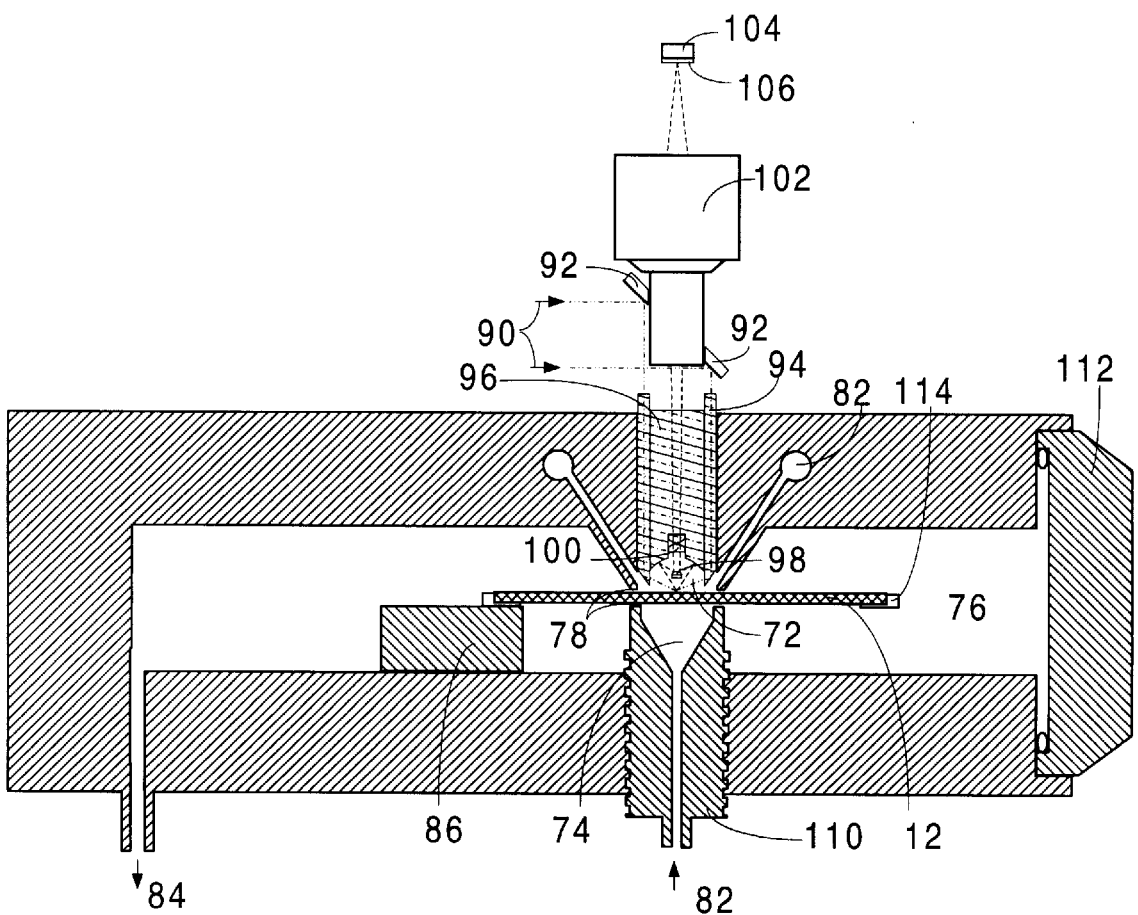
FIG. 4 shows a preferred embodiment of an optical inspection system employing super-critical immersion.

FIG. 4 shows a preferred embodiment in which super-critical immersion is used for wafer inspection. A portion of a wafer (12) is held between two high pressure regions of super-critical fluid, shown as an upper chamber (72) and a lower chamber (74). The wafer (12) is structured at or near enough to its surface, at least consisting of an oxide film on a substrate. The structure can also consist of additional films and patterning so that light reflecting and scattering off of the surface will be spatially structured. The two chambers leak fluid through precision ring spacers (78) into a low pressure load lock chamber (76). Super-critical fluid is continuously supplied to the high pressure chambers (72) and (74) through inlets (80) and (82), and the resulting expanded gas is pumped out of the low pressure load lock chamber (76) through an outlet (84), forming a differentially pumped configuration. This configuration has the advantages that less super-critical fluid is required, and that the large chamber need only support tens of psi of differential pressure instead of a thousand psi. The wafer is positioned in x and y using a 2-D linear motor (86), which could be floated on a fluid bearing of the same composition as the super-critical fluid. The z position of the wafer is predetermined by the positions of the precision ring spaces (78) and the relative pressures in the two high pressure chambers (72) and (74).

The wafer is illuminated by light (90) reflecting off of a mirror (92), passing through a cylindrical waveguide with a beveled end (94), and reflecting off of the bevel onto the surface of the wafer. Silvering can be used on the waveguide if the index of the waveguide is less than the index of the super-critical fluid. Specularly reflected light and scattered light off of the patterns on the wafer, together referred to as reflected structured light, are collected by a primary mirror (96), after which they pass in series through a secondary mirror (98), a meniscus lens (100), and an objective lens (102). The reflected structured light is then imaged onto a detector (104). The detector can be a variety of devices including a single photosensor or an array of photosensors, a time delayed integration camera, or a vidicon. In the preferred embodiment a fluorescent film (106) converts the ultraviolet illumination to visible wavelengths that are more efficiently detected by the sensor (104).

To load or remove a wafer from the apparatus, first the center post (110) is lowered, then the entrance door (112) is opened and the linear motor (86) moves the wafer frame (114) partially out of the low pressure load lock chamber (76).

It should be understood that the foregoing description is only illustrative of the invention. Various alternatives and modifications can be devised by those skilled in the art without departing from the invention. Accordingly, the present invention is intended to embrace all such alternatives, modifications, and variances which fall within the scope of the appended claims.

What is claimed is:

1. A process for illuminating a structured surface, comprising:
   introducing a fluid into a volume, said fluid nearly completely chemically inactive with respect to said structured surface;
   establishing within said volume a pressure and temperature which maintains said fluid in a supercritical state;
   immersing the structured surface in said supercritical fluid; and
   directing optical energy through the supercritical fluid and onto said structured surface.

2. A process as in claim 1, wherein the optical energy is spatially structured in accord with planar features.

3. A process as in claim 2, wherein the structured surface contains photosensitive material that changes composition in response to the optical energy.

4. A process as in claim 1, wherein the structured surface is a portion of a circuitry pattern on a semiconductor wafer.

5. A process as in claim 4, wherein the structured surface is entirely immersed in the supercritical fluid.

6. A process as in claim 1, wherein the super-critical fluid contains xenon.

7. A process as in claim 1, further comprising:
   reflecting a fraction of the optical energy from the structured surface back into the supercritical fluid;
   collecting a portion of the optical energy reflected from the structured surface; and
   imaging the collected optical energy onto a photoresponsive detector.

8. A process for optically characterizing a patterned surface, the process comprising:
   immersing the patterned surface in a supercritical fluid that is nearly completely chemically inactive with respect to said patterned surface;
   illuminating the patterned surface with optical energy that passes through the supercritical fluid, the optical energy selected from the group consisting of: visible and ultraviolet wavelengths;
   collecting onto a detection means scattered optical energy that has been transmitted through the supercritical fluid after scattering from the patterned surface; and
   generating a signal in the detection means from the collected, scattered optical energy to enable a characterization of the patterned surface.

9. The process of claim 8, wherein the supercritical fluid contains xenon.

10. The process of claim 9, wherein the supercritical fluid is maintained approximately at room temperature.

11. The process of claim 8, wherein the optical energy is directed at the patterned surface from within a first range of solid angles with respect to the patterned surface, and the scattered optical energy is collected from within said first range of solid angles.

12. The process of claim 8, wherein the optical energy is directed at the patterned surface from within a first range of solid angles with respect to the patterned surface, and the scattered optical energy is collected from outside the first range of solid angles.

13. The process of claim 8, wherein the patterned surface resides on a semiconductor substrate.

14. A process for optically projecting an image onto a photoresist covered surface, the process using a transmission mask defining the image to be projected and a system of lenses and mirrors for forming an image of the transmission mask, the process comprising:

immersing the photoresist covered surface in a supercritical fluid that is nearly completely chemically inactive with respect to said photoresist covered surface;

aligning the photoresist covered surface in the supercritical fluid so that the image of the transmission mask produced by the system of lenses is aligned with a predetermined orientation of the photoresist covered surface;

illuminating the mask with optical energy comprising optical radiation selected from the group consisting of visible and ultraviolet wavelengths; and projecting optical energy that has passed through the mask with the system of lenses and mirrors through the supercritical fluid and onto the photoresist covered surface.

15. The process of claim 14, wherein the supercritical fluid contains xenon.

16. The process of claim 14, wherein a portion of the system of lenses and mirrors is immersed in the supercritical fluid.

17. The process of claim 14, wherein the photoresist covered surface is a portion of a semiconductor circuit.

* * * * *